(12) United States Patent
O'Neill (10) Patent No.: US 8,455,936 B2
(45) Date of Patent: Jun. 4, 2013

(54) CONFIGURABLE MEMORY SHEET AND PACKAGE ASSEMBLY

(75) Inventor: Peter Mark O'Neill, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 632 days.

(21) Appl. No.: 12/712,554

(22) Filed: Feb. 25, 2010

(65) Prior Publication Data

US 2011/0204917 A1 Aug. 25, 2011

(51) Int. Cl.
*H01L 23/48* (2006.01)
*H01L 29/76* (2006.01)

(52) U.S. Cl.
USPC .......................... 257/296; 257/686; 257/777

(58) Field of Classification Search
USPC .................. 257/295–310, 686, 777, E27.071, 257/E27.104, E25.006, E21.614
See application file for complete search history.

(56) References Cited

U.S. PATENT DOCUMENTS

| | | | |
|---|---|---|---|
| 6,410,431 B2 | 6/2002 | Bertin et al. | |
| 6,600,186 B1 | 7/2003 | Lee et al. | |
| 6,917,063 B2 * | 7/2005 | Natori et al. | 257/295 |
| 7,300,857 B2 | 11/2007 | Akram et al. | |
| 7,317,256 B2 | 1/2008 | Williams et al. | |
| 7,589,406 B2 | 9/2009 | Wood | |
| 8,158,973 B2 * | 4/2012 | Ng et al. | 257/295 |

* cited by examiner

*Primary Examiner* — Cuong Q Nguyen (57) ABSTRACT

A configurable memory sheet includes a plurality of segmentable memory banks arranged on a repeating grid such that the plurality of segmentable memory banks can be configured for applications with a variety of circuit elements, where the plurality of segmentable memory banks are configured into memories by their connections to the variety of circuit elements.

21 Claims, 6 Drawing Sheets

CONFIGURABLE MEMORY SHEET AND PACKAGE ASSEMBLY

BACKGROUND

A modern application specific integrated circuit (ASIC) requires a significant amount of random access memory (RAM) to operate satisfactorily. In an example, for networking applications, the memory needs to be accessed at a high rate with low latency. Often, a single ASIC chip needs to read and write independently to multiple memory elements. One present solution to the need for ASIC memory access is to use dynamic RAM (DRAM) embedded in a logic process, so-called embedded DRAM or eDRAM, to locate memory near the logic that accesses it and to connect the memory to the logic using a wide bus. eDRAM memory is dense and, being on the same chip with the ASIC logic, allows dense, high-speed interconnections between the memory and the logic. eDRAM also avoids the slow, narrow, power-hungry interface entailed in connecting a logic die to separate DRAM dice through either packages and a printed circuit board (PCB) or in a side-by-side multi-chip module (MCM).

Embedded DRAM however presents a number of challenges. The additional processing steps to embed the memory with the logic adds cost and reduces yield. The embedded DRAM is not as dense as it is in a dedicated DRAM and it is less stable. In the case of some available embedded DRAM technologies, a stacked-capacitor deepens the first contact to a point at which it significantly increases its resistance and capacitance thus lowering the performance of the logic. Lastly, embedded DRAM technology is not widely available.

In integrated circuit (IC) technology, a circuit almost always performs better and costs less when it is built in a process designed for its function, so partitioning the system into separate logic and DRAM chips is attractive. The high parasitics of the connection between separate dice on a PCB or even an MCM substrate might be alleviated by stacking one die on the other. However, until recently, stacked dice have almost always been connected by wirebonding at their perimeters, which greatly limits the number and quality of the connections. For many communication system and networking chips, multiple wide logic to memory buses with low parasitics are desired.

Recently, interconnect technologies known as fine pitch through-silicon via (TSV) and metal-to-metal bonds have been developed to enable the fabrication of stacked dice having an area array interconnect in a "through-silicon stacking" (TSS) architecture. An area array interconnect using TSVs and metal-to-metal bonds provide physically short, low parasitic connections, to provide what can be referred to as "I/O-less on-chip access to off-chip technology." Such through-silicon stacking allows the consideration of partitioning an IC device into separate logic and DRAM dice.

Advantages of through-silicon stacking of logic and DRAM over connecting them together on a PCB or MCM include, for example, lower power consumption and higher speed due to dramatically lower interconnect parasitics, interface simplification, wider, denser interface permitting higher data transfer rate and greater architectural flexibility, and less printed circuit board (PCB) area, which can also be a disadvantage with regard to heat removal.

Therefore, it would be desirable to have a way of developing an integrated circuit whose performance can be maximized through the availability of die stacking technologies.

SUMMARY

In an embodiment, a configurable memory sheet includes a plurality of segmentable memory banks arranged on a repeating grid such that the plurality of segmentable memory banks can be configured for applications with a variety of circuit elements, where the plurality of segmentable memory banks are configured into memories by their connections to the variety of circuit elements.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A configurable memory sheet allows simple integration of DRAM with a variety of different ASICs. In an embodiment, a configurable memory sheet is fabricated using repeating DRAM banks. The repeating DRAM banks are partitioned into chips based on the configuration of the ASIC device with which the DRAM will be used. The repeating DRAM banks are integrated with an area array of contacts. The array of contacts can be arranged on a predetermined grid spacing, depending on the fabrication process used to fabricate the DRAM. For example, a solder bump array can be used to connect the DRAM banks to the package substrate using solder bumps arranged on a 150 micrometer (μm) grid. Other grid spacing is contemplated. The contacts on the predetermined grid spacing can also accommodate through silicon vias (TSVs). The TSVs can be formed through the configurable memory sheet and implemented to deliver power from a package substrate to the configurable memory sheet and also through the configurable memory sheet to an ASIC device located adjacent the configurable memory sheet.

The configurability of the memory sheet stems from the ability to customize the connections between the memory banks on the configurable memory sheet and the ASIC by the arrangement of the ASIC's circuit blocks and the routing of the ASIC's connections to the configurable memory sheet, as well as by using a front side redistribution layer (RDL) to provide connection between the configurable memory sheet and the ASIC. The front side RDL allows a relatively simple and inexpensive processing step to customize the connections between the configurable memory sheet and the ASIC. In this manner, the use of separate processes to fabricate the memory and the ASIC allow each to be separately and independently optimized and a single memory sheet design can be used with multiple ASIC designs.

The configurability of the memory sheet also stems from the ability to customize the power and signal connections between the configurable memory sheet and the solder bump array by using a back side redistribution layer (RDL). The back side RDL allows a relatively simple and inexpensive processing step to customize the connections between the configurable memory sheet and the solder bump array on the package substrate.

Because the configurable memory sheet generally uses a smaller portion of the total number of available solder bumps for power and ground than does the ASIC, the configurable memory sheet also allows access points for testing circuit elements on the memory.

In an embodiment, an ASIC die and the die formed using portions of the configurable memory sheet are arranged in a face-to-face configuration. Such an arrangement allows a heatsink to be attached to a rear surface of the ASIC for heat dissipation. Preferably, the two dice in the stack have approximately the same dimensions because high power ASICs generally need a fully populated solder bump array to uniformly supply electrical power and because the thermal conductivity of silicon maximizes the transfer of heat from the bottom die (e.g., the DRAM) through the top die (e.g., the ASIC) to the heatsink by materials with matched coefficients of thermal expansion (CTE).

It is preferable for the ASIC at the top of the stack to be oriented face down with its rear surface to the heatsink for a number of reasons. First, finer pitch connections can be made between the dice by bonding pads face-to-face as opposed to bonding back-to-front with through-silicon vias. Second, since power is distributed over a die by relatively thick upper metal layers, either TSVs carrying power from the back, or bundles of back-end-of-line (BEOL) vias, must extend to the top metal, thus blocking the routing of the other layers of metal. Such a blockage would impose severe restrictions on device circuit layout. However, face-to-face stacking with approximately equal die sizes uses TSVs to supply signals and power using the solder bump array on the grid spacing defined herein. Since the density of the external power and signal connections is less than the anticipated density of ASIC logic to DRAM connection, and since it is easier to address the signal routing issue in a regular structure, it is simpler to put the DRAM on the bottom and design it to accommodate the TSVs. This also places all the non-standard processing into one die—the DRAM, which, being a standard wafer, can share its design and process development effort over an entire family of ASICs.

Further, mounting the bottom chip (the DRAM) in a face-up orientation instead of a conventional "flip-chip" orientation presents another advantage. Since most package substrates have a significantly higher CTE than silicon, the solder bumps and die surface are subjected to considerable mechanical stress as the die and package temperature changes. Maintaining reliable electrical connection in the presence of such "die-to-package" interaction is a major challenge for nanometer-scale complementary metal oxide semiconductor (CMOS) technologies, particularly for large chips. This is so because of the poor mechanical strength and adhesion of the low dielectric constant insulators used in the BEOL metal stack. By placing the solder bumps on the back of the die a stronger, better-adhering material such as silicon dioxide formed using a tetraethyl orthosilicate precursor (TEOS) can be used to insulate the solder bumps from the silicon substrate. Since the backside metal is coarse, its insulator can be made thick to reduce capacitance.

Figure 1:
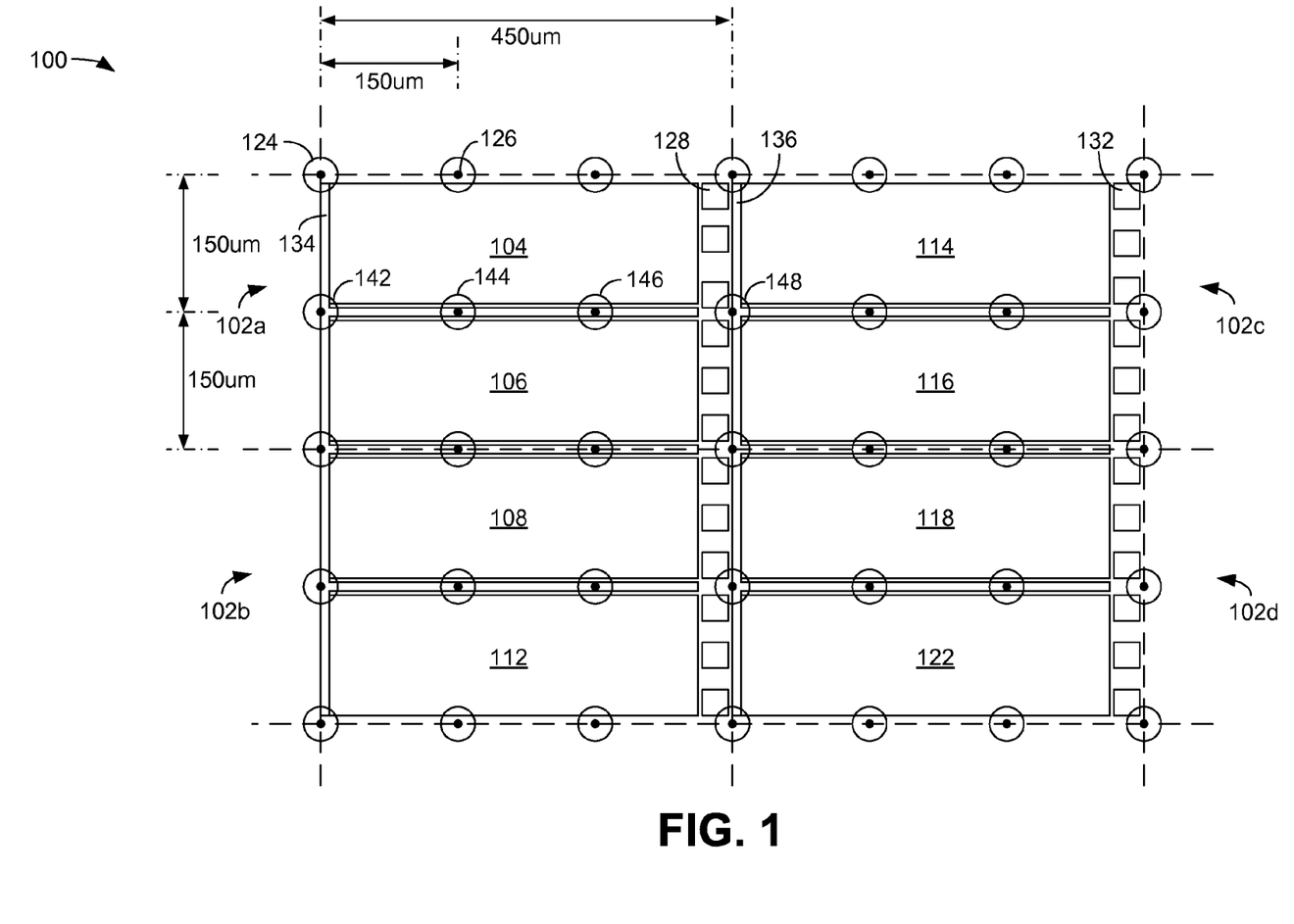
FIG. 1 is a schematic diagram illustrating a portion of an embodiment of a configurable memory sheet.

FIG. 1 is a schematic diagram illustrating a portion of an embodiment of a configurable memory sheet 100. The configurable memory sheet 100 can be thought of as a "pseudo-chip" representing a unit in which repeating instances of the configurable memory sheet 100 are photolithographically exposed during wafer fabrication and probed during wafer test. The configurable memory sheet 100 is fabricated using a process that is optimized for use in fabricating dynamic random access memory (DRAM). For example, the DRAM can be fabricated using a trench-capacitor process, a stacked-capacitor process, or any other DRAM fabrication process known to those skilled in the art. Each configurable memory sheet 100 is constructed from a number of different layers, including, for example, a substrate layer, such as silicon, one or more layers that include the active memory elements and one or more layers that include connections within the configurable memory sheet.

The configurable memory sheet 100 includes a number of pads 124. The pads 124 are laid out on a grid, which in this example, is a grid having a pitch of 150 micrometers ($\mu m$)× 150 $\mu m$. In an embodiment, a connection structure referred to as a through silicon via (TSV) 126 can be associated with some or all of the pads 124. Typically, TSVs 126 can be formed in the configurable memory sheet 100 over the entire array of pads 124, but need not occupy every pad location.

The configurable memory sheet 100 also comprises an array of unconnected DRAM banks 102 dispersed throughout the regular (150 $\mu m$×150 $\mu m$) solder bump array, which is designed primarily as a power distribution network for delivering power to the DRAM banks 102 and to a circuit (for example, an ASIC, but not shown in FIG. 1) that is mated to the configurable memory sheet 100. Some pads 124, particularly those under the ASIC die perimeter, carry input/output signals instead of power. It should be mentioned that the 150 $\mu m$ dimension is not particularly significant. Any regular grid dimension can be implemented such that a DRAM bank 102 fits between solder bumps at their minimum pitch.

In the embodiment shown n FIG. 1, the configurable memory sheet 100 includes DRAM banks 102a, 102b, 102c and 102d. It should be mentioned that although four DRAM banks 102 are shown, a typical configurable memory sheet 100 will have many hundreds or even many thousands of such DRAM banks 102. Each DRAM bank 102 comprises a complete memory containing memory cells, row and column decoders, sense amplifiers, and repair resources. Since the DRAM does not need power to be delivered on the full TSV grid, frontside probe pads can be connected to all the TSVs used to power the final stack and some of these can be used to probe DRAM test signals. For instance, the center four pads 142, 144, 146 and 148 of the DRAM bank 102a could also function as a traditional scan test access port (TAP) for the signals Test Mode Select (TMS), Test Data Input (TDI), Test Data Output (TDO), and Test Clock (TCK). After bonding, multiplexers (not shown) could then reconnect this TAP to micropads for testing of the stack and these TSVs then used to power the ASIC.

Alternatively, for more efficient manufacturing purposes, a number of DRAM banks 102 and associated design-for-test (DfT) structures 134 and process monitor structures 128 can be thought of as a pseudochip that contains all repeated patterns below the customization levels (to be described below) that can easily fit on a stepper reticle and that can be tested in a single probe touchdown. The pseudochip fits in one exposure field so that no patterns are stitched across exposure fields. In this manner, it is possible to test many DRAM banks 102 simultaneously. This way, programmable built-in self-test (BIST) engines and process monitors can be distributed over the process monitor/test spaces of the many DRAM banks of a pseudochip and a wide test port can be distributed over the DRAM banks. Since the BIST engine is built in the DRAM process while its test connections and pads are created in the redistribution layer (RDL) post-process, the differences in repeat intervals are accommodated by the RDL routing, which is accomplished by full-wafer lithography.

The configurable memory sheet 100, and in particular each DRAM bank 102, includes a number of memory subarrays. The DRAM bank 102a includes memory subarrays 104 and 106; the DRAM bank 102b includes memory subarrays 108 and 112; the DRAM bank 102c includes memory subarrays 114 and 116; and the DRAM bank 102d includes memory sub arrays 118 and 122. While two memory subarrays are illustrated in FIG. 1 for each DRAM bank 102, each DRAM bank 102 may comprise additional memory subarrays. Depending on the process by which the configurable memory sheet 100 is fabricated, each memory subarray can include a particular memory configuration. For example, each memory subarray shown in FIG. 1 can be fabricated to include a 16K×36 RAM structure. However, other memory structures are possible.

Each DRAM bank 102 is integrated with a grid of four (4) by three (3) pads 124. In an embodiment, each pad 124 is designed to correspond to an electrical and/or mechanical connection. For example, the pads 124 can be designed to accommodate a solder connection, referred to as a solder bump, a metal-to-metal fusion bond, or another electrical and mechanical connection, such that electrical contact can be made to elements within the configurable memory sheet 100. Alternatively, the pads 124 can be designed to accept any other type of connection, as will be described below. Generally, the pads 124 are designed to provide power (i.e., supply and ground signals), and test signal access.

In an embodiment, each TSV 126 can be formed to extend through layers of the configurable memory sheet 100 to provide electrical connectivity through the configurable memory sheet 100 to a logic element located over the configurable memory sheet 100, and to provide electrical connectivity to elements within the configurable memory sheet 100. Generally, the configurable memory sheet 100 has no circuit routing traces in the near vicinity of a TSV. Accordingly, what is referred to as a "TSV-last" process can be used to form the TSVs. A TSV-last process eliminates the requirement that the foundry that fabricates the configurable memory sheet 100 also fabricates the TSVs. Instead the TSV-last process allows the configurable memory sheet 100 to be fabricated to a general specification and it allows all of the memory sheet customization to be performed in a post-processing manner. An example assembly process bonds known-good ASIC dice to known-good DRAM sites, and then singulates the DRAM wafer and assembles the ASIC/DRAM stacks into packages. The configurable memory sheet 100 is configured into a die to match the memory structure, die size, and power and input/output (I/O) solder bump configuration of the ASIC to which it will be mated. As will be described below, configuration is done primarily in a front side redistribution metal layer (RDL) and associated pad and contact layers. For added flexibility to accommodate I/O bumps from the regular bump/power grid, the TSVs may also be configured to the ASIC. All of these configurable layers are fabricated using inexpensive masks and processes after the configurable memory sheet 100 is fabricated using conventional DRAM processing. Further, prior to integrating the configurable memory sheet 100 with an additional circuit die, such as an ASIC, the configurable memory sheet 100 can be wafer tested by probing the pads 124 that will later deliver power to the ASIC.

The configurable memory sheet 100 also includes a number of process monitors 128 and 132. The process monitors 128 and 132 are generally formed in predetermined locations on the configurable memory sheet 100, and are used to monitor the fabrication process when the configurable memory sheet 100 is being fabricated. The configurable memory sheet 100 also includes design for test (DfT) blocks 134 and 136. The DfT blocks 134 and 136 serve as conduits for the application of test signals from test probes (not shown) to the memory circuit elements within the configurable memory sheet 100 being tested. Further, the DfT blocks 134 and 136 may also serve to generate and evaluate test patterns.

The configurable memory sheet 100 is designed to be segmented, or divided, into sections that correspond to the logic element (in this example, an application specific integrated circuit (ASIC)) with which the configurable memory sheet is being integrated. For example, an ASIC can be vertically integrated over sectioned portions of the configurable memory sheet 100 such that the two elements form a vertically integrated package having a similar footprint. The configurable memory sheet 100 is designed to be sectioned along the dotted lines shown in FIG. 1 such that 450 μm×300 μm portions of the configurable memory sheet 100 can be formed, depending on the memory needs and the physical requirements of the ASIC to which the configurable memory sheet 100 will be paired. In an embodiment, many hundreds of sections of DRAM banks 102 will be formed for any particular ASIC application. The integration of the configurable memory sheet 100 and an application-specific integrated circuit will be described in further detail below.

Figure 2:
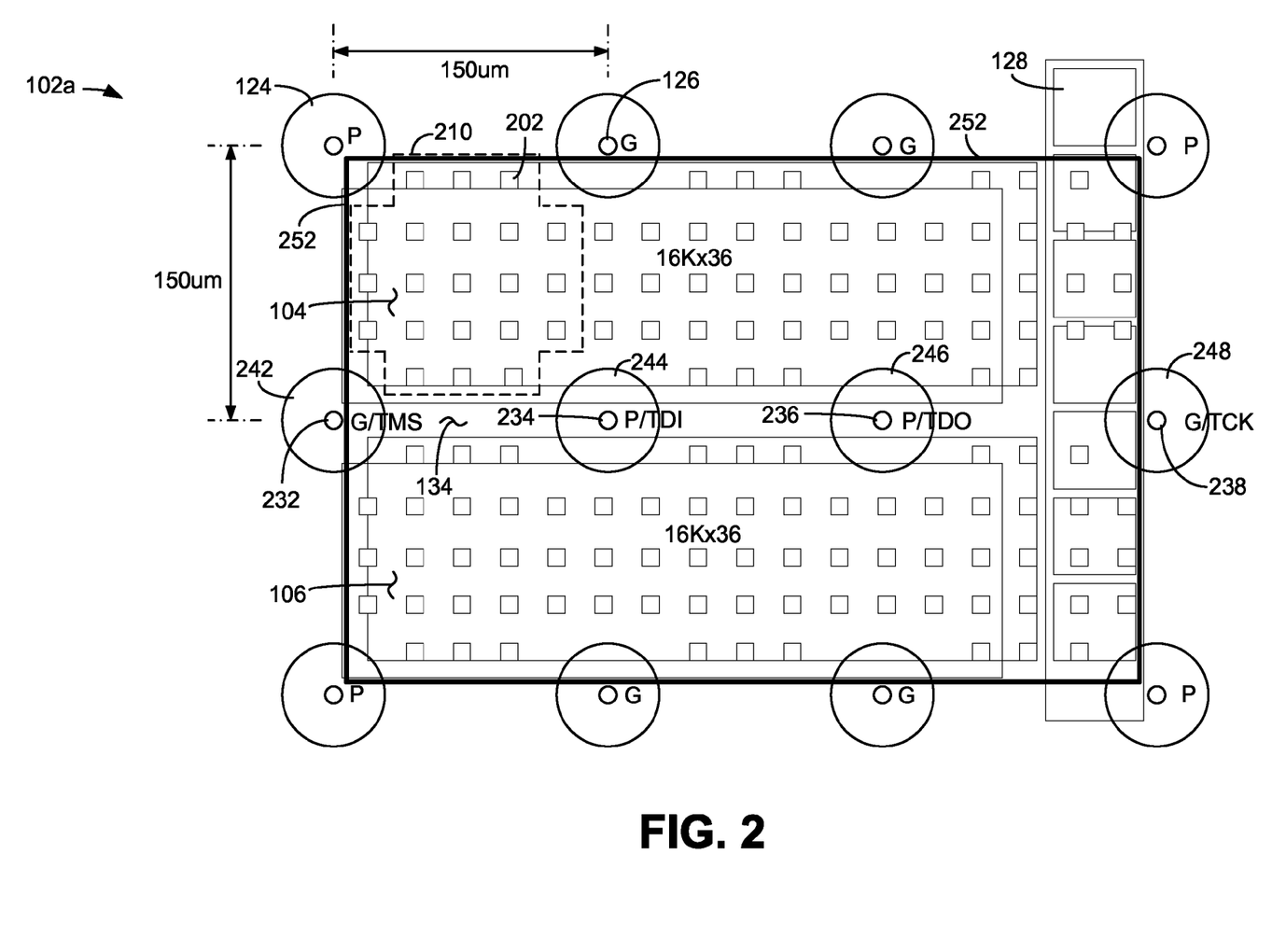
FIG. 2 is a schematic diagram illustrating a DRAM bank of FIG. 1.

FIG. 2 is a schematic diagram illustrating a DRAM bank 102a of FIG. 1. The DRAM bank 102a includes subarray 104 and subarray 106. The number of subarrays in a DRAM bank 102 is arbitrary, and generally driven by design factors. For example, The DRAM bank 102a is a memory cell array. In the embodiment shown herein, the DRAM bank 102a is split into two subarrays, 104, 106, to provide for the middle row of four TSVs, 232, 234, 236 and 238. Since a subarray is a solid, regular structure, it can't be punctured by a TSV and probe pad. The DRAM bank (comprising two subarrays in the example herein) uses a certain number of small interdie signal pads, also referred to herein as micropads, or micro-bond pads 202, to achieve the desired data transfer rate. In a particular implementation, it is desirable to provide for a data word that is approximately 72 bits wide. With available DRAM technology, it is possible to fit about 16 k of these words, which uses 14 address bits. Adding 4 control bits, this layout uses about 90 micropads 202. At an example pitch of 25 μm, these micropads 202 would fill the space between a 2×3 array of solder bumps. All of these pads together control and access the full array and are not separately allocated to the subarrays.

It is desirable to balance the number of micropads needed to address the bank at the desired word width against micropad pitch; and to balance the memory density against the solder bump pitch and the number of micropads needed to address the amount of memory thus accommodated.

The subarrays 104 and 106 are illustrated having micro-bond pads 202 to indicate electrical contact from the memory elements within the subarrays 104 and 106 to the top surface of the subarrays 104 and 106.

The DfT block 134 is shown as providing test access to the subarray 104 and to the subarray 106. The pads 124 and the TSVs 126 are illustrated in larger scale, but on the same example 150 μm pitch as shown in FIG. 1. As shown in FIG.

2, the subarray 104 and the subarray 106 share the 12 pads 124 after the DRAM bank 102a has been sectioned as described above with respect to FIG. 1. In this manner, a fully functioning DRAM bank 102a is created from the configurable memory sheet 100. Further, any number of fully functioning DRAM banks 102 can be formed from the configurable memory sheet 100 (FIG. 1), depending on the logic element to which the DRAM will be mated.

Preferably, to reduce manufacturing expense, the steps used to configure the configurable memory sheet 100 into dice for a specific ASIC should to be performed using coarse lithography and inexpensive masks. The mask field should encompass at least one DRAM bank, but process monitors 128 and DfT blocks 134 (136, FIG. 1), may benefit from a larger field, i.e. a pseudochip of multiple banks. This can be accomplished using a full-wafer (300 mm) 1:1 proximity exposure by a mask aligner such as the IQ mask aligner available from the EV Group, Phoenix Ariz., or another suitable mask aligner available from, for example, Canon Corporation. This minimizes restrictions on repeating lithography features across the wafer such as might be desired to temporarily share test resources during wafer probe. However, such large masks may be expensive and such aligners may not be available at all vendors so that a stepping projection aligner, such as one available from Ultratech, Inc., may be used. In such a case, the DfT block 134 and process monitors 128 should be made to fit the stepper's limited field size. Using a stepper should avoid circuit stitching issues because the exposure field can be sized to abut at DRAM die boundaries that will be cut at singulation.

To be able to be cut on a fine grid to approximate the ASIC dimensions, the configurable memory sheet 100 comprises small, repeating units. For high speed, low latency memory access and for easy configurability, in an embodiment, the configurable memory sheet 100 comprises many, small, wide (72-bit word) DRAM banks 102.

In an embodiment, the configurable memory sheet 100 is mated with an ASIC that is fabricated using a 40 nanometer (nm) process that includes a 150 μm solder bump pitch to distribute power. In such an embodiment, using a 58 nm DRAM fabrication process provides a cell size of 0.0202 μm$^2$ with an area efficiency of 56%. Conservatively reducing the efficiency to 50% to account for the small DRAM bank size, and using a 72-bit wide DRAM bank 102, results in the ability to fit 21 of the 25 μm pitch micro-bond pads 202 in the 150 μm square area 210 between pads 124, thus using six such squares to accommodate the I/O of a DRAM bank 102.

Therefore, the configurable memory sheet 100 includes DRAM banks 102, which occupy an area of 2×3 pads 124 (300 μm×450 μm) with a data organization of 72 k×16 k for a capacity of 1.18 Mb. This provides 512 Mb capacity to cover a large ASIC. For example, a 12 mm square die would include 39×25=975 DRAM banks 102 for a total memory of 1.15 Gbits. The interface would be 72 data+14 address+4 control (RAS, CAS, CE, RW)=90 micro-bond pads 202, or 15 micro-bond pads 202 per square. However, 6 such squares can accommodate 138 of the 25 μm pitch micro-bond pads 202 if needed. Space is provided along the edge of each DRAM bank 102 for DRAM process control monitors 128 and alignment marks (not shown).

After fabrication and test, the die containing the configurable memory sheet 100 is singulated. Singulation is the process of separating the wafer into individual chips. Singulation can be performed by cutting with a diamond saw. However, to reduce damage around the cut lines sometimes the cutting is initiated by a laser through the metal and dielectric layers and then finished with a saw through the silicon. In some applications, a deep etch is used to separate the chips. In conventional integrated circuits the cut lines are devoid of circuitry. However, in the example configurable memory sheet described herein, the cuts are made through inactive memory elements so as to save the substantial space that would be occupied by incorporating an unpopulated cut line (also known as a scribe street or saw kerf) into each repeated memory bank.

Some of the DRAM memory banks are not used. Therefore, the unused DRAM banks can be deactivated and isolated from the active DRAM banks by patterning the front RDL so that damage to the unused DRAM banks does not electrically affect the final product.

There are two concerns with cutting through circuitry. First, there exists the possibility of shorting metal layers in the metal stack by smearing the metal over the wall of the cut. To prevent this from occurring, the cut circuits can be disconnected from the rest of the memory die by appropriately forming the front RDL. Second, there exists the possibility of cracking and delaminating the layers of the metal stack. This damage can propagate laterally, but can be eliminated by applying a seal ring 252 around each cut DRAM bank 102. As known in the art, a seal ring 252 contacts all the metal layers to adjacent layers through their separating dielectric layers.

The pads 124 and respective TSVs 126 that supply power and ground are labeled "P" and "G" respectively, in FIG. 2. However, at least a portion of the pads 124 can be used to not only supply power (power and ground) but also to provide test access. For example, as described above in FIG. 1, in addition to providing power (P) and ground (G), the center four pads 242, 244, 246 and 248 could also function as a traditional scan test access port (TAP) for the signals TMS, TDI, TDO, and TCK. The pad 242 can provide ground (G) and access to the TMS test signal; the pad 244 can provide power (P) and access to the TDI test signal; the pad 246 could provide power (P) and access to the TDO test signal; and the pad 238 could provide power (P) and access to the TCK test signal.

Figure 3:
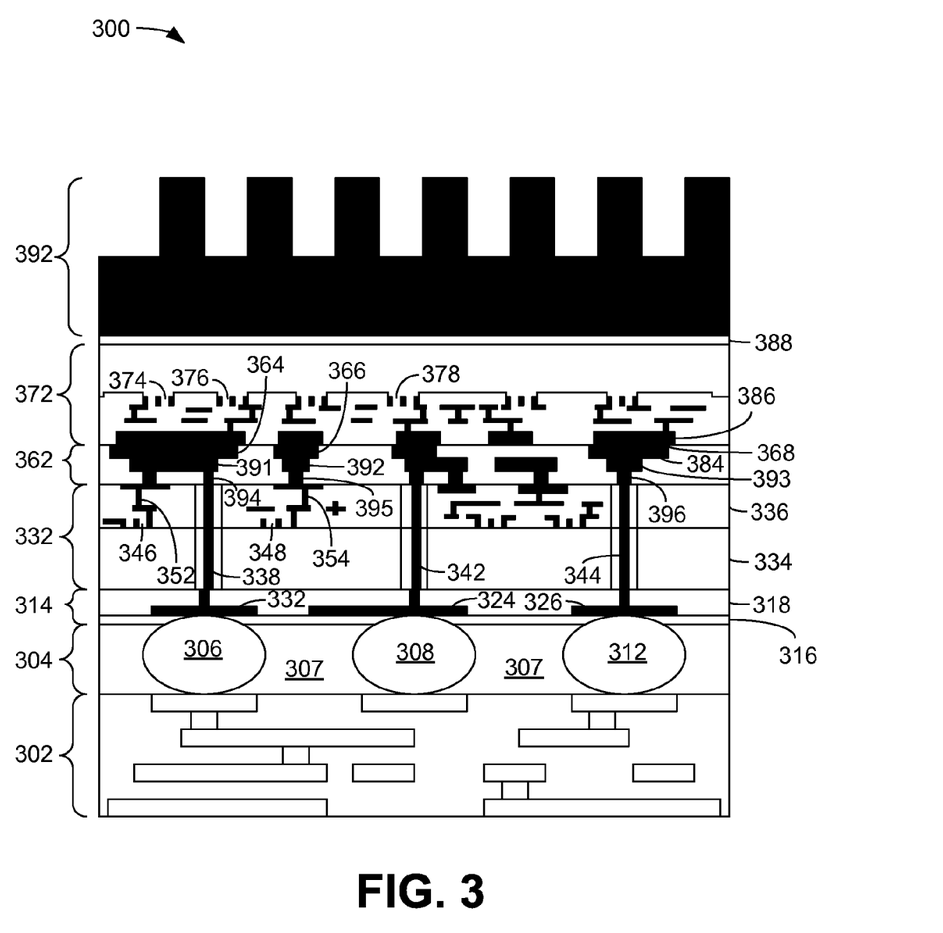
FIG. 3 is a schematic diagram illustrating a cross-sectional view of an integrated package assembly in which an application specific integrated circuit is oriented in a face to face configuration with a portion of the configurable memory sheet.

FIG. 3 is a schematic diagram illustrating a cross-sectional view of an integrated package assembly 300, including stacked semiconductor dice, in which an application specific integrated circuit is oriented in a face to face configuration with a portion of the configurable memory sheet 100.

The package assembly 300 includes a package substrate 302 over which a connection layer 304 is formed. In this package example, the connection layer 304 comprises solder bumps 306, 308 and 312 that form a solder bump array, as described above. An underfill material 307 occupies the space between the solder bumps 306, 308 and 312. The solder bumps 306, 308 and 312 correspond to the pads 124 shown in FIGS. 1 and 2. Although a small portion of the circuitry is shown in FIG. 3, it is to be understood that there can be many hundreds or thousands of such solder bump connections in an actual package assembly. The package substrate 302 provides connection for the package assembly to a printed circuit board (PCB) a printed wiring board (PWB) or other assembly on which the package assembly 300 is ultimately installed.

A back side redistribution metal layer (RDL) 314 is formed over a surface of the memory sheet 332 to provide connection to the connection layer 304. The backside RDL 314 includes a backside dielectric layer 318 against which a backside passivation layer 316 is formed. The backside dielectric layer 318 comprises a strong dielectric to isolate and insulate the solder bumps from the rear surface of the memory sheet 332, thereby alleviating effects of die-to-package thermal expansion mismatch The backside RDL 314 also includes circuit traces 322, 324 and 326. The circuit traces 322, 324 and 326 provide electrical connection from respective solder bumps 306, 308 and 312, to the memory sheet 332.

The memory sheet 332 illustrates a section of the configurable memory sheet 100 after the memory sheet is sectioned. The memory sheet 332 can also be referred to as the DRAM die. The memory sheet 332 includes a silicon layer 334 and a die interconnect stack layer 336, through which are formed TSVs 338, 342 and 344, respectively. In an embodiment, the TSVs 338, 342 and 344 are formed using a TSV-last process as described above and as known to those skilled in the art. Alternatively, the TSVs can be formed using a TSV-middle process, as also known to those skilled in the art.

The die interconnect stack 336 includes examples of circuitry located in the memory sheet 332. The circuitry 346 and 348 are merely two examples of active memory elements that can be contained in the memory sheet 332. Many additional circuitry elements can be part of the memory sheet 332. The memory sheet 332 also includes electrical connectivity elements located through the die interconnect stack 336 as shown by exemplary circuit traces 352 and 354. Similarly though unnumbered for ease of illustration, the die interconnect stack 336 includes many other circuit elements and circuit interconnect elements. The die interconnect stack 336 is the layer in which the active memory elements, such as memory element 346 and memory element 348, are shown at the transistor device level. Importantly, and in accordance with an aspect of the configurable memory sheet 100, through silicon vias (examples of which are shown using reference numerals 338, 342 and 344) are formed so as to extend completely through the memory sheet 332, on the same grid pattern as are the solder bumps 306, 308 and 312.

A front side redistribution metal layer (RDL) 362 is formed over the memory sheet 332. The front side RDL 362 provides electrical connectivity from the memory sheet 332 to the ASIC 372, and allows the memory sheet 332 to be generically formed as the configurable memory sheet 100 shown in FIGS. 1 and 2. In this manner, the configurable memory sheet 100 can be fabricated in a process optimized for DRAM fabrication and then customized to any of a number of logic elements (such as the ASIC 372) using the front side RDL 362.

The front side RDL 362 includes exemplary probe, interdie and bonding pads 364, 366 and 384, respectively. The front side RDL 362 also includes exemplary conductive traces 391, 392 and 393, which form the electrical paths of the redistribution layer, and includes exemplary contact layer portions 394, 395 and 396, which fill the holes that make contact to the top metal layer of the memory sheet 332. However, there are many additional pads, conductive traces and contact layer portions within the front side RDL 362, so that signals can be connected from the ASIC 372 to the memory sheet 332. The pads 364, 366 and 384, the circuit traces 391, 392 and 393 and the contact layer portions 394, 395 and 396 can be formed using copper, or another electrically conductive material. As an example, the pad 384 includes a corresponding pad 386 located within the ASIC 372. An exemplary technique to attach the ASIC 372 to the front side RDL 362 can include copper-to-copper fusion bonding along the line 368 between the pads on the upper surface of the front side RDL 362 and the pads on the facing surface of the ASIC 372. In such an implementation, the pads 384 and 386 are implemented as what is referred to as interdie fusion pads, and the ASIC 372 is electrically coupled to the memory sheet 332 using a fine-pitch area array interdie interconnect. Copper-to-copper fusion bonding occurs when copper surfaces are brought together at room temperature after being polished smooth and chemically activated. The bond is made permanent by a low-temperature (e.g. 125° C.) anneal under light pressure. As an alternative to fusion micro solder bumps can be used at a temperature of around 300° C. to provide the bond, or possibly thermo-compression bonding can be used at approximately 400° C. Fusion bond pads can be on the order of 10 μm×10 μm on a 25 μm pitch with die-to-die alignment of 1 μm or better. Micro solder bumps are coarser—on the order of 40 μm pitch. All of these connection methods usually dedicate a layer of metal to bonding pads.

Some memory banks in the memory sheet 332 are not used by the ASIC 372 because they are not needed, they are damaged by singulation, or their TSVs are used to transmit signals from the ASIC 372 outside to the package. As previously mentioned, it is desirable to isolate these unused memory banks from the used memory banks. Thus the repeating memory bank structure is designed so that all of its connections to the TSVs it encloses and all interdie pads (micropads) are made by the front side RDL 362. The front side RDL 362 is customized to each mating ASIC design. Since all power is carried by the TSVs, not patterning connections between the power TSVs and a memory bank isolates the memory bank from power. Similarly, since all memory address, data, and control signals are carried between the ASIC 372 and a memory bank by micropads, not patterning these pads in the front side RDL 362 on a particular bank disconnects these signals from the memory bank.

Generally, the configurable memory sheet 100 includes active memory banks and inactive memory banks. The inactive memory banks are deactivated and isolated from the active memory banks by patterning the front side RDL 362. In the case where the memory banks were rendered inactive by cutting through them to singulate the memory sheet this is done so that damage to the separated inactive memory banks does not electrically affect the active memory banks. In the case where the memory banks are inactive because they are not needed, isolating them saves power and lessens noise coupling into active circuits.

The ASIC 372, which can also be referred to as the ASIC die, includes exemplary circuit elements 374, 376 and 378. The ASIC 372 also includes exemplary conductive traces 382 and 386. Although unnumbered for simplicity, the ASIC 372 includes many additional active circuit elements and electrical conductors.

A heat sink 392 is coupled to the ASIC 372 using a thermal interface 388. Generally, the ASIC 372 will generate significantly more heat than will the memory sheet 332. The heat generated by the ASIC 372 is transferred directly through the thermal interface 388 to the heatsink 392. Heat generated by the memory sheet 332 will be transferred to the ASIC 372 along the TSVs and across the interface 368.

In accordance with another embodiment of the configurable memory sheet 100, mounting the memory sheet 332 and the ASIC 372 in a face-to-face orientation as shown in FIG. 3, simplifies the connections to the package substrate 302 and also allows the TSVs 338, 342 and 344 to provide a fully populated power grid to deliver power to the memory sheet 332 and to the ASIC 372.

External signals and power (those which do not exclusively run between the ASIC die and the DRAM die) are communicated to the package substrate 302 using the TSVs.

In the past, connections between the die (the die having the configurable memory sheet 332 and the die having the ASIC 372) and the package 302 are made by wire bonds or solder bumps to pads on the face of the die. Since the die having the configurable memory sheet 332 and the die having the ASIC 372 are bonded face-to-face and are of the same size, neither face is exposed. Therefore the signals and power from the shared face are routed using the TSVs through the bottom die (the die having the configurable memory sheet 332) to the package 302. Further, locating a solder bump (e.g., 306) at an end of a TSV (e.g., 338) produces less capacitance and resistance than running a length of backside RDL from the TSV to a bump.

To maximize the integrity of the signals and power carried by the TSVs, the TSVs are arrayed directly on top of their corresponding solder bumps and the DRAM circuitry and interdie fusion pads are fit between them as shown in FIG. 3. The CTE mismatch between the silicon die and the copper that fills the TSV creates a strain field surrounding the TSV. This strain affects transistor performance (primarily mobility) so FETs are excluded from a radius of approximately 2-3 TSV radii from the TSV center.

Figure 4:
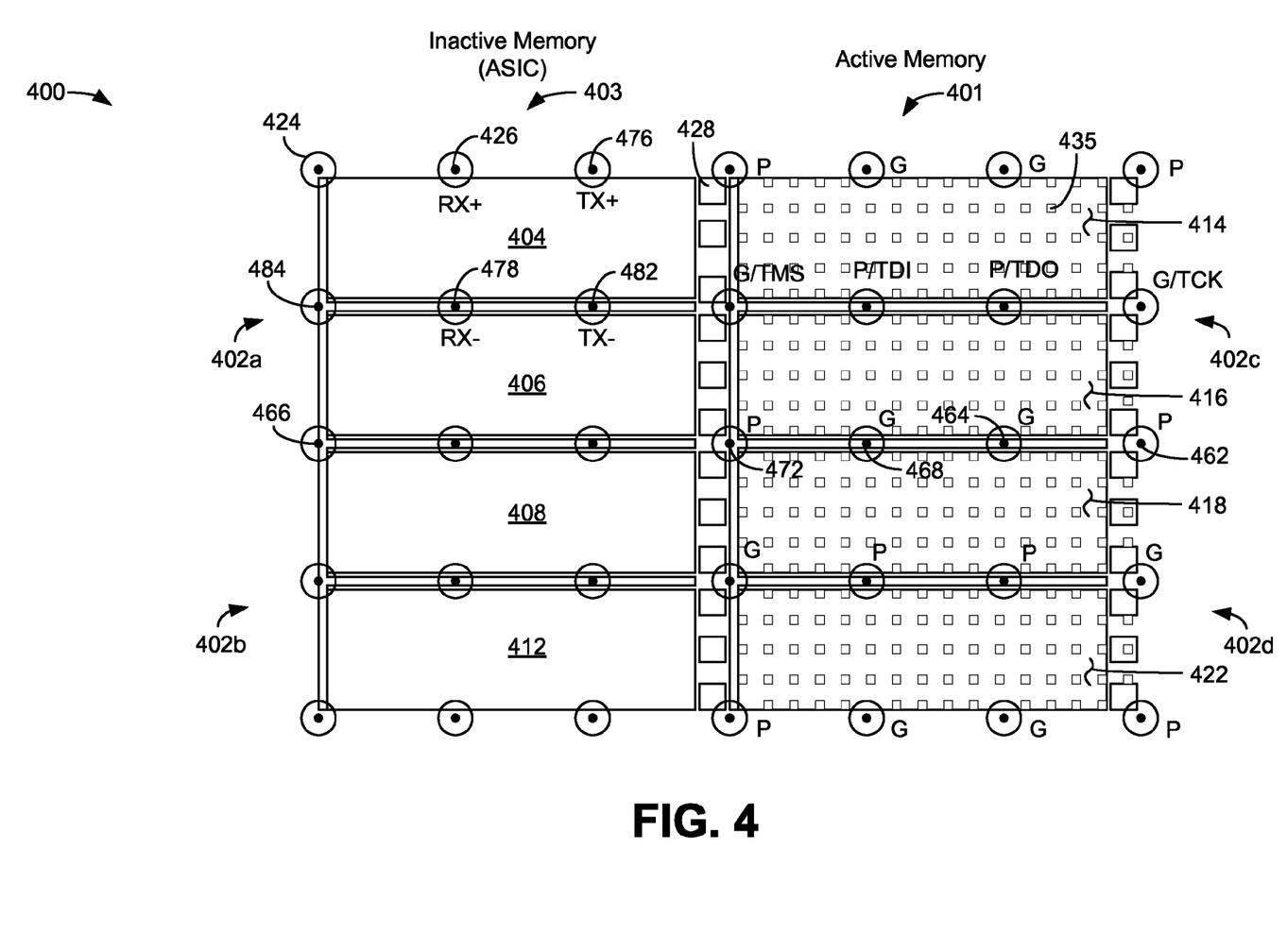
FIG. 4 is a schematic diagram illustrating a configurable memory sheet configured to have active memory and inactive memory.

FIG. 4 is a schematic diagram illustrating a configurable memory sheet 400 configured to have active memory 401 and inactive memory 403. The inactive memory 403 can be located adjacent to ASIC elements that do not necessarily require the use of active memory 401. The configurable memory sheet 400 includes DRAM banks 402a, 402b, 402c and 402d. The DRAM bank 402a includes subarrays 404 and 406. The DRAM bank 402b includes subarrays 408 and 412. The subarrays 404, 406, 408 and 412 are fabricated without micro-bond pads 202 (FIG. 2) because no memory connections thereto are required for the inactive memory 403.

The DRAM bank 402c includes subarrays 414 and 416 and the DRAM bank 402d includes subarrays 418 and 422. The DRAM banks 402c and 402d are implemented as active memory as described above, and therefore include micro-bond pads 435 to connect ASIC circuitry (not shown) to active memory elements. The micro-bond pads 435 are similar to the micro-bond pads 202 described above.

The assignment of the TSVs and the use of the DRAM banks 402 depends on the particular requirements and functionality of the ASIC circuit to which they mate. Under core ASIC circuitry the TSVs only provide power so they alternate between power and ground in such a way that abutting DRAM banks 402 can share solder bumps. For example, the DRAM bank 402c shares power TSV 462 and ground TSV 464 with DRAM bank 402d.

Memory banks 402c and 402d represent active memory banks so that the TSVs on their boundary (i.e., TSVs 462, 464, 468 and 472) describe how the TSV power and ground pattern matches on memory bank abutment.

The memory banks 402a and 402b illustrate unused memory. The memory bank 402a illustrates an unused memory bank that is instead used to provide input and output (I/O signals to an ASIC through an unused memory bank. For example, in an embodiment where the ASIC contains a differential serialized/deserializer (SERDES) the TSV 426 can be used to carry the RX+ signal, the TSV 476 can be used to carry the TX+ signal, the TSV 478 can be used to carry the RX− signal and the TSV 482 can be used to carry the TX− signal. Other TSVs in the unused memory bank 402a can be used to carry, for example, one or more power supply signals for the I/O functions. The elements (i.e., pads, connected TSVs and solder bumps) that would otherwise be part of the power distribution network are reassigned by the design of the front side RDL 362 to signals entering or exiting the stacked chips that comprise the package assembly 300. This is accomplished by disconnecting (making inactive) the memory banks (e.g., 402a in FIG. 4) in which they are located. This feature of selectively re-assigning pads from power to I/O allows the configurable memory sheet 100 work in high power applications. The memory bank 402b is illustrated as a completely unconnected memory bank, and as such, carries no signals.

The memory sheet 332 (FIG. 3) receives power from these TSVs as connected by the front side RDL 362 (FIG. 3). If the memory sheet 362 uses different power supplies than the ASIC 372 (FIG. 3) then the TSVs are assigned to power supplies in a more complicated pattern and the front side RDL 362 is connected accordingly. Since DRAM memory sheet 332 consumes significantly less power than does the ASIC 372, the DRAM memory sheet 332 does not require power and ground to be supplied by every P and G pair of TSVs. The memory sheet 332 under the ASIC core (the active memory 401) is used as needed by the ASIC 372. Memory banks 402 that are not used can be disconnected from power by not connecting them to power or ground TSVs with the front side RDL 362. Similarly, micro-bond pads need not be formed on unused memory banks or on the ASIC area adjacent to them since there are no interdie signals there, as shown by inactive memory 403.

When a DRAM bank 402 lies beneath an ASIC I/O, as in the DRAM banks 402a and 402b on the left side of FIG. 4, which can be located at the perimeter of the ASIC 372, most of the ASICs TSVs are dedicated to I/O signals and supplies so the DRAM bank is not useable, and is made inactive so as to not couple noise into the ASIC I/O signal paths. The unused DRAM bank 402 is completely disconnected.

Figure 5:
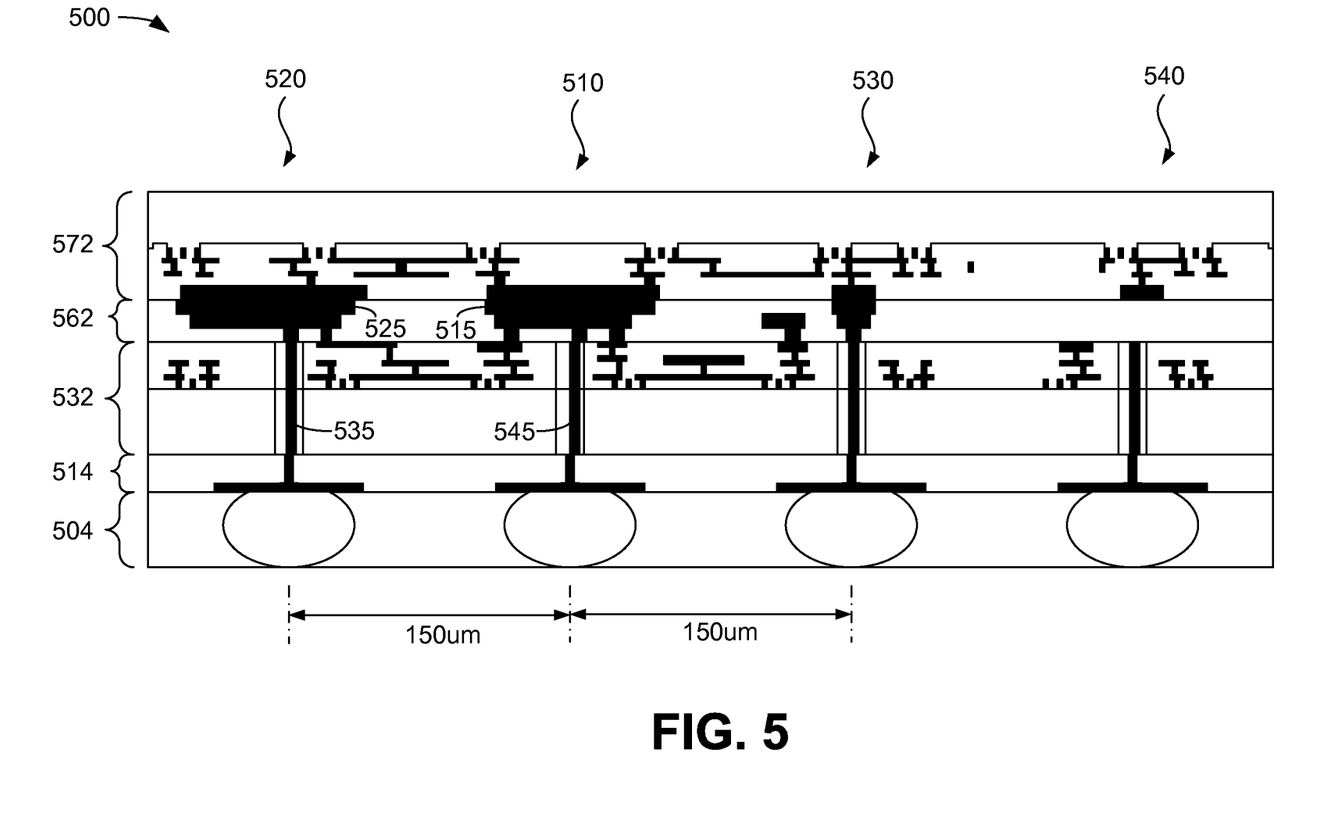
FIG. 5 is a schematic diagram illustrating a cross-sectional view of a portion of the package assembly of FIG. 3 showing stacked semiconductor dice.

FIG. 5 is a schematic diagram illustrating a cross-sectional view 500 of a portion of the package assembly 300 of FIG. 3. FIG. 5 illustrates four combinations of TSVs and pads that can be fabricated using the configurable memory sheet 100. The combination shown at 510 includes power being supplied to the ASIC 572 and to the memory sheet 532 and includes probeable pads on both the ASIC die and on the memory die for wafer test prior to bonding, power delivery to the stack and easy bonding.

The combination shown using reference numeral 510 includes a probeable pad 515 that provides a power feed to the memory sheet 532 and to the ASIC 572 where the relatively large pad size simplifies bonding.

The combination shown using reference numeral 520 includes a probeable test signal pad 525 that allows test access to the memory sheet 532 before bonding to the ASIC and a power feed to the ASIC 572 where the relatively large probe pad simplifies bonding. After bonding, the combination of the TSV 535 and pad 525 is used exclusively to power the ASIC 572, while the DRAM 532 permanently switches off its test signal connection to this pad stack.

Electrically the combination 510 connects to power supply wires in the memory bank while the combination 520 connects to memory test signals in the memory sheet 532.

The combination shown using reference numeral 530 illustrates a high-speed input-output path using micropads on both the ASIC die and the DRAM die to reduce capacitance. These pads are too small to be probed for test.

The combination shown using reference numeral 540 shows a solder bump and TSV completely disconnected front side RDL 562, which shows no connection between the memory sheet 532 and the ASIC 572.

Since the TSVs are on a probeable 150 µm pitch grid, the DRAM sheet 572 does not need power to be delivered on this fine a grid, and since capacitance generally helps the power system, front side probe pads can be connected to all the TSVs used to power the final package assembly 500 and some of these can be used to probe DRAM test signals. For example, as mentioned above, the center four pads 242, 244, 246 and 248 (FIG. 2) of a DRAM bank 102a (FIG. 2) could double as a traditional scan test access port for the signals TMS, TDI, TDO, and TCK. After bonding, multiplexers could then reconnect this TAP to micropads for testing of the package assembly and the TSVs 232, 234, 236 and 238 then used to power the ASIC 572.

Figure 6:
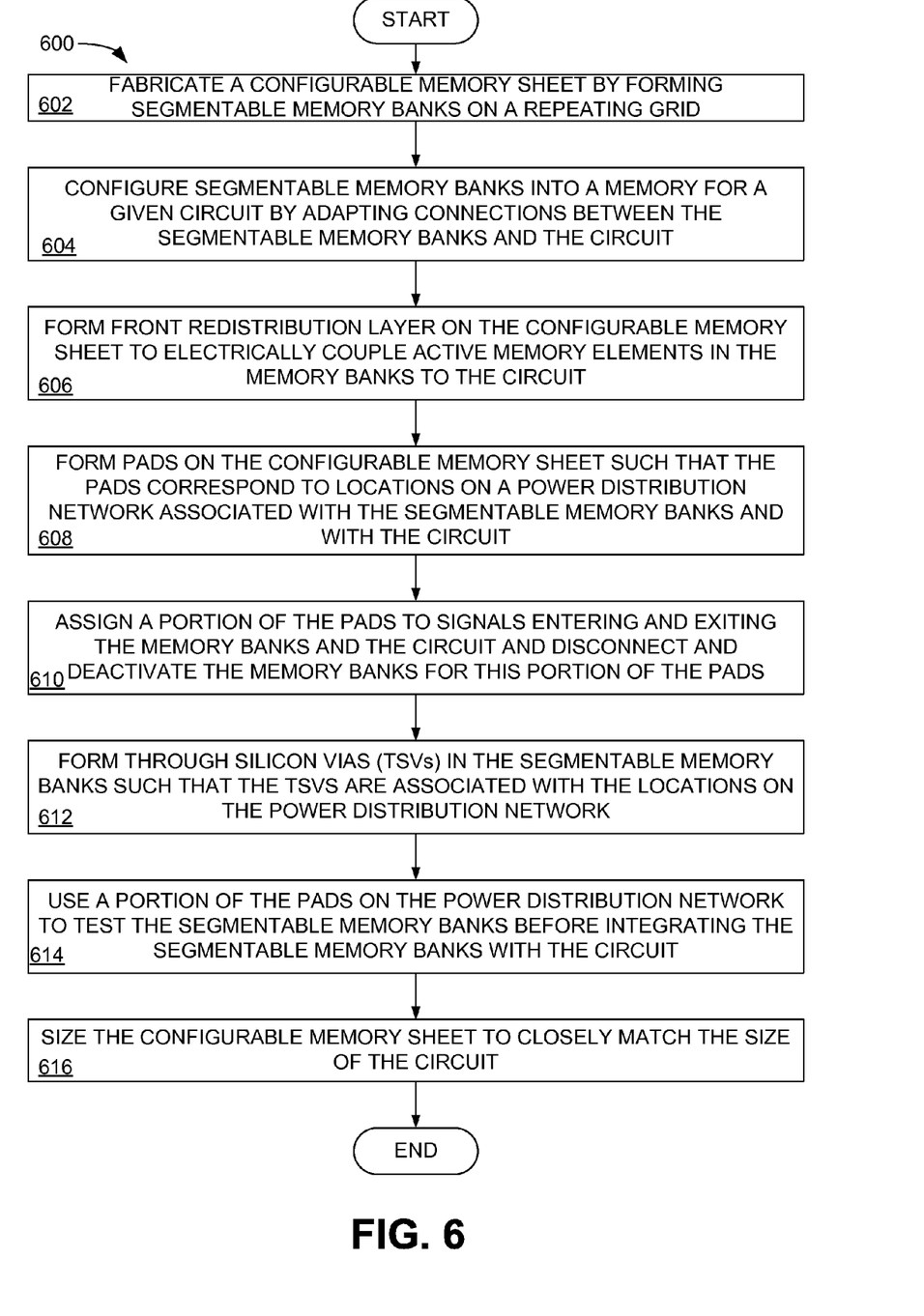
FIG. 6 is a flow chart illustrating the fabrication of an embodiment of the configurable memory sheet of FIG. 1 and the package assembly of FIG. 3.

FIG. 6 is a flow chart 600 illustrating the fabrication of an embodiment of the configurable memory sheet of FIG. 1 and the package assembly of FIG. 3. Although shown in a particular order, the blocks in the flow chart can be performed in or out of the order shown, and in certain embodiments, can be performed in parallel.

In block 602, a configurable memory sheet is formed by fabricating a plurality of segmentable memory banks on a repeating grid using a dedicated DRAM fabrication process. In block 604, the segmentable memory banks are configured for applications with a variety of circuit elements by adapting connections between the segmentable memory banks and a particular circuit element with which the segmentable memory banks will be mated.

In block 606, a front side RDL is formed on the configurable memory sheet to electrically couple active memory elements in the segmentable memory banks to circuitry on an ASIC.

In block 608, pads are formed on the configurable memory sheet such that each of the pads is associated with a corresponding location in a power distribution network. At least a portion of the pads are power pads that deliver electrical power to the configurable memory sheet and to the ASIC.

In block 610, a portion of the pads (and connected TSVs and solder bumps) that otherwise would be part of the power distribution network are assigned to signals entering or exiting the integrated package assembly 300 and disconnecting, thereby making inactive, the memory banks in which this portion of the pads are located.

In block 612, a TSV is formed in the configurable memory sheet at each location that includes a pad. Each TSV forms a substantially vertical connection between a location on the ASIC and a corresponding solder bump located on a rear surface of the configurable memory sheet.

In block 614, a portion of the power pads are used to test the configurable memory sheet before integrating the configurable memory sheet with the (ASIC). In block 616, the configurable memory sheet is sized to closely match the dimensions of the ASIC.

This disclosure describes the invention in detail using illustrative embodiments. However, it is to be understood that the invention defined by the appended claims is not limited to the precise embodiments described.

What is claimed is:

1. A configurable memory sheet, comprising:
a plurality of segmentable memory banks arranged on a repeating grid such that the plurality of segmentable memory banks can be configured for applications with a variety of circuit elements, where the plurality of segmentable memory banks are configured into memories by their connections to the variety of circuit elements.

2. The configurable memory sheet of claim 1, further comprising:
a front side redistribution layer (RDL) configured to electrically couple active memory elements on the segmentable memory banks to circuitry on an application specific integrated circuit (ASIC).

3. The configurable memory sheet of claim 2, further comprising:
a plurality of pads located on the configurable memory sheet, wherein each of the plurality of pads is associated with each of a plurality of locations in a power distribution network; and
a plurality of through silicon vias (TSVs) located in the configurable memory sheet, each of the plurality of TSVs associated with each of the plurality of pads, wherein each of a plurality of external signals and power pads on the ASIC has a direct vertical connection through a TSV to a solder bump located on a rear surface of the configurable memory sheet.

4. The configurable memory sheet of claim 3, wherein a portion of the pads are power pads that are used to test the configurable memory sheet before integrating the configurable memory sheet with an application specific integrated circuit (ASIC).

5. The configurable memory sheet of claim 4, wherein the configurable memory sheet is fabricated using a dedicated process and wherein the ASIC is fabricated using a dedicated process and in which the ASIC is located in a face-to-face orientation with the configurable memory sheet and wherein the ASIC is electrically connected to the configurable memory sheet using a fine-pitch area array interdie interconnect.

6. The configurable memory sheet of claim 5, further comprising a heatsink coupled to the ASIC, wherein the ASIC is located over the configurable memory sheet to facilitate efficient cooling.

7. The configurable memory sheet of claim 5, further comprising using at least a portion of the plurality of TSVs of a de-activated segmentable memory bank to carry signals and power of input/output elements of the ASIC.

8. The configurable memory sheet of claim 5, further comprising locating solder bumps on a rear surface of the configurable memory sheet adjacent to a surface of a package substrate, the solder bumps insulated from the rear surface of the configurable memory sheet with a strong dielectric thereby alleviating effects of die-to-package thermal expansion mismatch.

9. The configurable memory sheet of claim 5, wherein the configurable memory sheet is sized to closely match the dimensions of the ASIC to facilitate conducting electrical power into and heat out of the ASIC.

10. The configurable memory sheet of claim 5, wherein the configurable memory sheet further comprises active memory banks and inactive memory banks, wherein the inactive memory banks are deactivated and isolated from the active memory banks by patterning the front side RDL.

11. The configurable memory sheet of claim 7, wherein the front side RDL is further configured to connect a segmentable memory bank to a power pad, to isolate a segmentable memory bank from a power pad, and to assign a TSV to the input/output elements of the ASIC.

12. A circuit package assembly, comprising:
a configurable memory sheet having a plurality of segmentable memory banks arranged on a repeating grid such that the plurality of segmentable memory banks can be configured for a particular application specific integrated circuit (ASIC), where the plurality of segmentable memory banks are configured into memories by their connections to the ASIC;
a front side redistribution metal layer (RDL) configured to electrically couple active memory elements on the segmentable memory banks to circuitry on the ASIC;
a plurality of pads located on the configurable memory sheet, wherein each of the plurality of pads is associated with each of a plurality of locations in the power distribution network; and
a plurality of through silicon vias (TSVs) located in the configurable memory sheet, each of the plurality of TSVs associated with each of the plurality of pads, wherein each of a plurality of external signals and power pads on the ASIC has a direct vertical connection through a TSV to a solder bump located on a rear surface of the configurable memory sheet.

13. The circuit assembly of claim 12, wherein the power pads are used to test the configurable memory sheet before integrating the configurable memory sheet with the ASIC.

14. The circuit assembly of claim 13, wherein the configurable memory sheet is sized by cutting through circuitry so as to closely match dimensions of the ASIC to facilitate conducting electrical power into and heat out of the ASIC.

15. The circuit assembly of claim 14, wherein the configurable memory sheet further comprises active memory banks and inactive memory banks, wherein the inactive memory banks are deactivated and isolated from the active memory banks by patterning the front side RDL.

16. The circuit assembly of claim 12, wherein the front side RDL is further configured to electrically couple active memory elements on the segmentable memory banks to the power pads, to connect a segmentable memory bank to a power pad, to isolate a segmentable memory bank from a power pad, and to assign a TSV to the input/output elements of the ASIC.

17. A method for making a configurable memory sheet, comprising:
    forming a plurality of segmentable memory banks on a repeating grid such that the plurality of segmentable memory banks can be configured for applications with a variety of circuit elements, where the plurality of segmentable memory banks are configured into memories by their connections to the variety of circuit elements.

18. The method of claim 17, further comprising:
    forming a front side redistribution metal layer (RDL) on the configurable memory sheet, the front side RDL configured to electrically couple active memory elements on the segmentable memory banks to circuitry on an application specific integrated circuit (ASIC), to connect a segmentable memory bank to a power pad, to isolate a segmentable memory bank from a power pad, and to assign a TSV to the input/output elements of the ASIC.

19. The method of claim 18, further comprising:
    forming a plurality of pads on the configurable memory sheet, wherein each of the plurality of pads is associated with each of a plurality of locations in a power distribution network; and
    forming a plurality of through silicon vias (TSVs) located in the configurable memory sheet, each of the plurality of TSVs associated with each of the plurality of pads, wherein each of a plurality of external signals and power pads on the ASIC has a direct vertical connection through a TSV to a solder bump located on a rear surface of the configurable memory sheet.

20. The method of claim 19, further comprising using a portion of the power pads to test the configurable memory sheet before integrating the configurable memory sheet with the (ASIC).

21. The method of claim 15, further comprising sizing the configurable memory sheet to closely match the dimensions of the ASIC to facilitate conducting electrical power into and heat out of the ASIC.

\* \* \* \* \*